(12) United States Patent
Jarmon et al.

(10) Patent No.: US 8,522,560 B2
(45) Date of Patent: Sep. 3, 2013

(54) FUEL-COOLED HEAT EXCHANGER WITH THERMOELECTRIC DEVICE COMPRESSION

(75) Inventors: David C. Jarmon, Kensington, CT (US); Jun Shi, Glastonbury, CT (US); Steve Lozyniak, S. Windsor, CT (US); Bradley C. Johnson, Palm Beach Gardens, FL (US)

(73) Assignee: United Technologies Corporation, Hartford, CT (US)

( * ) Notice: Subject to any disclaimer, the term of this patent is extended or adjusted under 35 U.S.C. 154(b) by 1041 days.

(21) Appl. No.: 12/550,150

(22) Filed: Aug. 28, 2009

(65) Prior Publication Data

US 2010/0242486 A1 Sep. 30, 2010

Related U.S. Application Data

(60) Provisional application No. 61/211,009, filed on Mar. 25, 2009.

(51) Int. Cl.
*F02K 7/08* (2006.01)

(52) U.S. Cl.
USPC ............................................. 60/768; 60/267

(58) Field of Classification Search
USPC ................... 60/266, 267, 730, 767, 768, 801, 60/39.83; 244/53 R, 57–60; 62/3.2, 3.6, 62/3.61
See application file for complete search history.

(56) References Cited

U.S. PATENT DOCUMENTS

| 2,990,775 A | | 7/1961 | Henson |
| 3,733,826 A | | 5/1973 | Wolf et al. |
| 4,037,751 A | * | 7/1977 | Miller et al. ................... 428/593 |
| 4,065,936 A | | 1/1978 | Fenton et al. |
| 4,372,211 A | | 2/1983 | Dante |
| 4,580,524 A | | 4/1986 | Lackey, Jr. et al. |
| 5,135,184 A | | 8/1992 | Billig |
| 5,337,975 A | | 8/1994 | Peinemann |
| 5,584,183 A | * | 12/1996 | Wright et al. ...................... 62/3.7 |
| 5,874,775 A | | 2/1999 | Shiomi et al. |
| 5,892,656 A | | 4/1999 | Bass |
| 6,042,315 A | | 3/2000 | Miller et al. |

(Continued)

FOREIGN PATENT DOCUMENTS

| EP | 1746257 A2 | 1/2007 |
| JP | 2004156827 A | 6/2004 |
| KR | 20030057985 A | 7/2003 |

OTHER PUBLICATIONS

R. F. Faulkner et al., "Hyrdrocarbon Scramjet Propulsion System Development, Demonstration and Application," AIAA 99-4922, American Institute of Aeronautics and Astronautics, Nov. 1-5, 1999 (pp. 1-8).

(Continued)

*Primary Examiner* — Phutthiwat Wongwian
*Assistant Examiner* — Scott Walthour
(74) *Attorney, Agent, or Firm* — Kinney & Lange, P.A.

(57) ABSTRACT

An apparatus includes an inlet conduit assembly surrounding a gas flow path and a combustor arranged downstream of the inlet conduit assembly. The inlet conduit assembly includes a thermoelectric (TE) device configured to convert heat into electrical energy, a gas flow conduit arranged between the gas flow path and the TE device, and a resilient member configured to bias the TE device into contact with the gas flow conduit.

27 Claims, 6 Drawing Sheets

(56) References Cited

U.S. PATENT DOCUMENTS

| | | | |
|---|---|---|---|
| 6,045,310 | A | 4/2000 | Miller et al. |
| 6,300,150 | B1 | 10/2001 | Venkatasubramanian |
| 6,499,306 | B2 | 12/2002 | Gillen |
| 6,627,019 | B2 | 9/2003 | Jarmon et al. |
| 6,894,215 | B2 | 5/2005 | Akiba |
| 6,907,920 | B2 | 6/2005 | Warburton et al. |
| 7,018,200 | B2 | 3/2006 | Querejeta et al. |
| 7,210,653 | B2 | 5/2007 | Atkey et al. |
| 7,254,953 | B2 | 8/2007 | Callas et al. |
| 7,385,503 | B1 | 6/2008 | Wells et al. |
| 2003/0234008 | A1 | 12/2003 | Van Winkle |
| 2004/0045594 | A1 | 3/2004 | Hightower |
| 2004/0124308 | A1 | 7/2004 | Daggett |
| 2004/0134195 | A1* | 7/2004 | Bouchez et al. ........ 60/767 |
| 2005/0022855 | A1 | 2/2005 | Raver |
| 2006/0063522 | A1 | 3/2006 | McFarland |
| 2006/0101822 | A1 | 5/2006 | Murata |
| 2007/0018038 | A1 | 1/2007 | Jarmon et al. |
| 2008/0083447 | A1 | 4/2008 | Sienel |
| 2010/0242437 | A1* | 9/2010 | Jarmon ........ 60/266 |

OTHER PUBLICATIONS

R. Kazmer, "Hypersonic Propulsion at Pratt & Whitney—Overview," AIAA 2002-5144, American Institute of Aeronautics and Astronautics, 2002 (pp. 1-5).

W. Wong, "Advanced Radioisotope Power Conversion Technology Research and Development," NASA/TM-2004-213352, AIAA-2004-5515, Second Int'l Energy Conversion Engineering Conference, Dec. 2004 (12 pages).

J. J. Oswald et al., "Modeling and Evaluation of Canted Coil Springs as High Temperature Seal Preloading Devices," NASA/TM-2004-213189, AIAA-2004-3889, Sep. 2004 (16 pages).

* cited by examiner

FUEL-COOLED HEAT EXCHANGER WITH THERMOELECTRIC DEVICE COMPRESSION

CROSS-REFERENCE TO RELATED APPLICATION(S)

The present application claims priority to U.S. Provisional Pat. App. Ser. No. 61/211,009 entitled FUEL-COOLED HEAT EXCHANGER WITH THERMOELECTRIC DEVICE COMPRESSION filed Mar. 25, 2009, which is hereby incorporated by reference in its entirety.

STATEMENT OF GOVERNMENT INTEREST

The Government may have certain rights in this invention pursuant to Contract No. FA8650-07-C-7721 awarded by the United States Air Force.

BACKGROUND

Hypersonic vehicles hold potential for future military application by shortening the time-to-target and thereby extending global reach. These vehicles are anticipated to be powered by scramjet (supersonic combustion ramjet) engines during hypersonic flight conditions. The structure which forms the hypersonic flow path in a scramjet engine is referred to in the art as a heat exchanger (HEX), which is a reference to the dual use of the flow conduit structure as a heat exchanger. Hypersonic HEXs are commonly fuel-cooled because air-cooling is not practical in hypersonic flight conditions. Fuel cooling also serves to preheat the combustion fuel, thereby adding energy to the fuel for combustion. In conventional jet engines, fuel pumps, on-board electric systems, and other accessory systems parasitically draw power from the engine's main power plant to function. However, unlike conventional jet engines, scramjet engines have no rotating mechanical elements. Hypersonic vehicles are therefore currently envisioned to rely on auxiliary power units (APUs) and/or batteries to meet the vehicle power requirements. However, both APUs and battery systems add significant weight, volume and system complexity.

SUMMARY

An apparatus according to the present invention includes an inlet conduit assembly surrounding a gas flow path and a combustor arranged downstream of the inlet conduit assembly. The inlet conduit assembly includes a thermoelectric (TE) device configured to convert heat into electrical energy, a gas flow conduit arranged between the gas flow path and the TE device, and a resilient member configured to bias the TE device into contact with the gas flow conduit.

DETAILED DESCRIPTION

Figure 1:
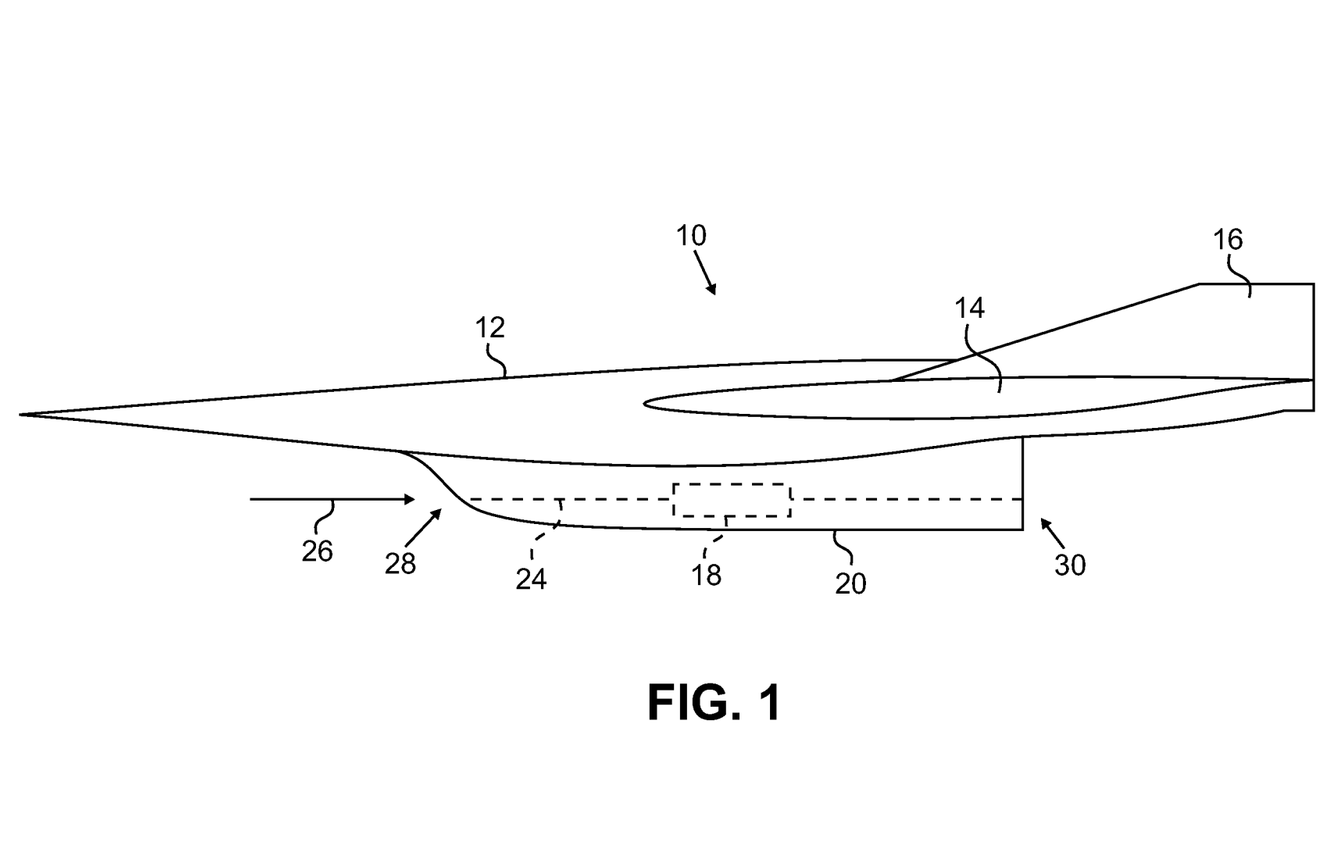
FIG. 1 is a schematic view of vehicle including hybrid gas turbine and ramjet engine.

FIG. 1 is a schematic view of vehicle 10 including fuselage 12, wing 14, tail assembly 16, engine 18, and cowl 20. Vehicle 10 may be, for example, a manned aircraft. Alternative vehicles may be unmanned and may be reusable or may be one-way vehicles (e.g., missiles or disposable launch vehicles). Although this description is made with reference to a vehicle, embodiments of the present invention are applicable to any platform that includes demanding thermal management and power generation needs. In FIG. 1, wing 14 and tail assembly 16 are supported by fuselage 12. Engine 18 is located in cowl 20 on an underside of fuselage 12. Air flow path 24 carries a flow 26 through engine 18 between a forward inlet/intake 28 and an aft outlet 30 (e.g., an exhaust nozzle).

Figure 2:
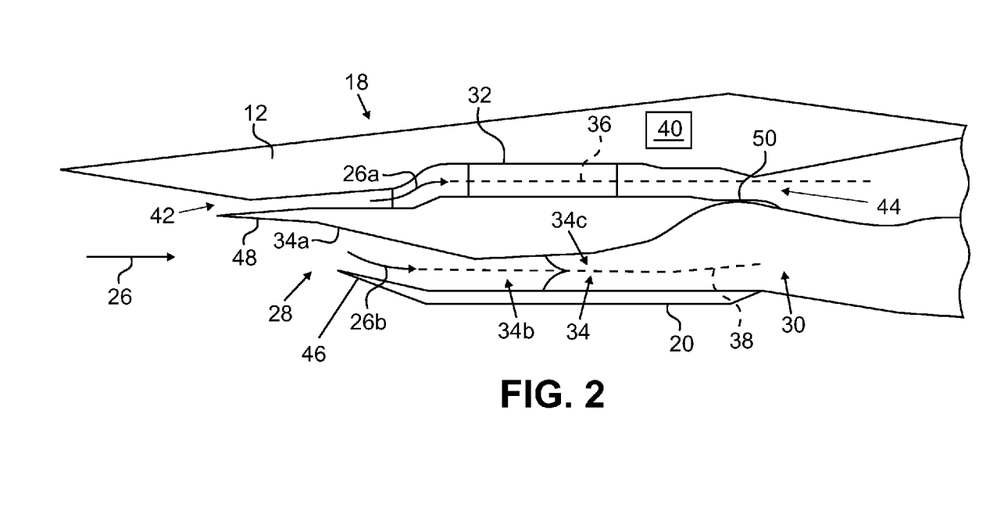
FIG. 2 is a schematic view of the hybrid gas turbine and ramjet engine of FIG. 1.

FIG. 2 is a schematic view of engine 18 located in cowl 20. Engine 18 includes gas turbine 32 and ramjet 34. An exemplary ramjet is a dual mode (i.e., subsonic and supersonic combustion) ramjet engine (i.e., a dual mode scramjet). A ramjet generally comprises a constricted tube through which inlet air is compressed by the high speed of the vehicle, a combustion chamber where fuel and compressed air are combusted, and a nozzle through which the exhaust jet leaves at higher speed than the inlet air, thereby generating thrust to power a vehicle in flight. There are few or no moving parts in a ramjet. In particular, there is no high-speed turbine, as in a turbofan or turbojet engine, that is expensive to produce and maintain. A ramjet requires airflow through the engine (in a scramjet the airflow must be supersonic), and therefore has a minimum functional speed. For example, in the hybrid vehicle shown in FIGS. 1-3, turbine 32 may be used to power vehicle 10 up to an appropriate speed beyond which ramjet 34 may augment or replace turbine 32 to power vehicle 10.

In FIG. 2, a portion 26a of air flow 26 can be directed along flow path 36 into turbine 32, while another portion 26b of flow 26 can be directed along flow path 38 into ramjet 34. Flow path 38 carries a flow 26b through ramjet 34 between forward inlet/intake 28 and aft outlet 30. Along flow path 26b, ramjet 34 may include a forebody 34a, an isolator 34b (often integrated therewith), and a combustor 34c. During operation, air is scooped into ramjet 34 through forebody 34a and compressed along isolator 34b before entering combustor 34c. The compressed air is mixed with fuel in combustor 34c and ignited. The products of combustion are exhausted through outlet 30 to produce useful thrust used to power vehicle 10 in flight. As shown in FIG. 2, engine 18 may also include control system 40 configured to control operation of combustor 34c in response to one or more of sensor input, operator input, and the like. Control system 40 may optionally be included as a portion of the avionics of vehicle 10.

Gas turbine 32 is located along air flow path 36 carrying flow 26a between a forward inlet/intake 42 and an aft outlet 44 inboard of ramjet flow path 26b (e.g., partially recessed into fuselage 12 above cowl 20). Ramjet and turbine inlet flaps 46 and 48, respectively, can selectively block ramjet and turbine inlets 28, 42 and flow paths 38, 36 when ramjet 34 or turbine 32, respectively, is not in operation. Similarly, turbine outlet flap 50 may selectively block turbine flow path 36 when turbine 32 is not in use so as to provide an efficient nozzle for ramjet 34.

Figure 3:
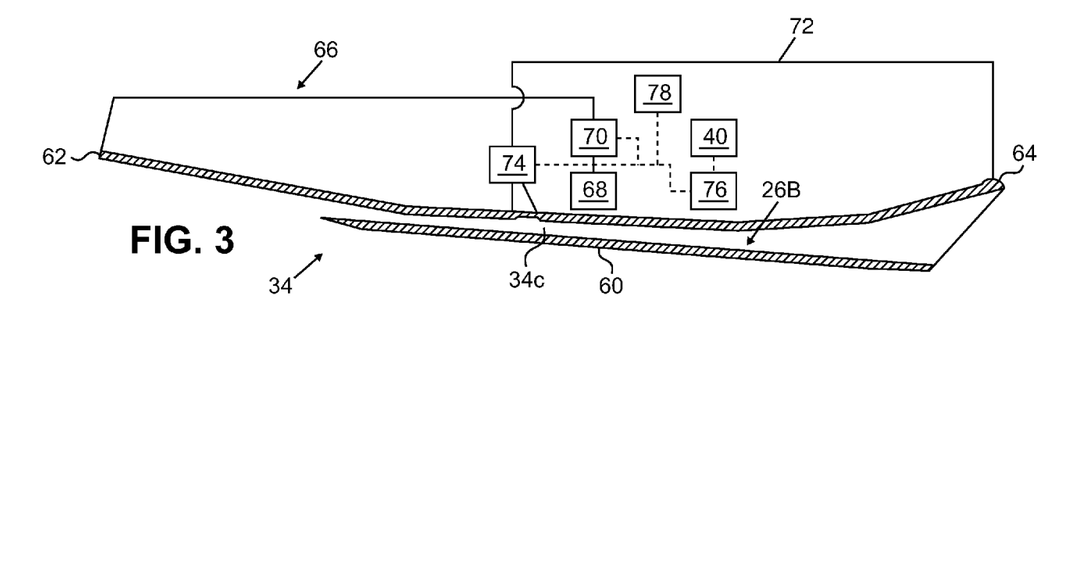
FIG. 3 is a schematic axial section view of the ramjet of FIG. 2 including a fuel-cooled heat exchanger.

FIG. 3 is a schematic axial section view showing further details of the ramjet engine 34 and flow 26b. At least a portion of flow 26b is largely surrounded by heat exchanger (or conduit assembly) 60 for transferring heat from the air and combustion gases in ramjet 34 to pre-combustion ramjet fuel. A radially inward face of heat exchanger (or HEX) 60 forms a gas flow conduit through which flow 26b of ramjet 34 passes. Heat exchanger 60 can be formed as a generally rectangular conduit surrounding flow 26b, sometimes referred to as a 2-D configuration, or as an annular conduit circumscribing flow 26b, sometimes referred to as a 3-D configuration. For an exemplary hydrocarbon-based fuel, heat exchanger 60 is a liquid-fuel-cooled heat exchanger. An alternative fuel used to cool heat exchanger 60 is a hydrogen gas. Heat exchanger 60 can have an upstream fuel inlet 62 and a downstream fuel outlet 64. In the illustrated embodiment, the inlet 62 is upstream of combustor 34c along flow path 26b. Heat exchanger 60 can thereby be used to pre-heat the fuel used in combustor 34c using the hot air and fuel mixture exiting combustor 34c. Fuel flow 66 of ramjet 34 can extend from storage tank 68 to fuel pump 70 and then to inlet 62. After exiting outlet 64, heated fuel may pass along flow path 72 to a fuel distribution valve network 74 and then to combustor 34c. The valves of network 74 distribute the fuel to various combustor locations for various purposes (e.g., piloting v. main combustion) and to achieve desired staging.

In addition to pre-heating combustion fuel, heat exchanger 60 thermoelectrically generates electricity. Accordingly, exchanger 60 can be coupled to an electrical power conditioning, storage, and distribution system, such as system 76 shown schematically in FIG. 3. System 76 can receive raw electrical input from heat exchanger 60 and output appropriate electricity (e.g., of a constant and proper voltage) to drive, for example, control system 40, fuel pump 70, distribution valves of the network 74, similar components associated with turbine 32, and additional loads schematically shown as 78.

Figure 4A:
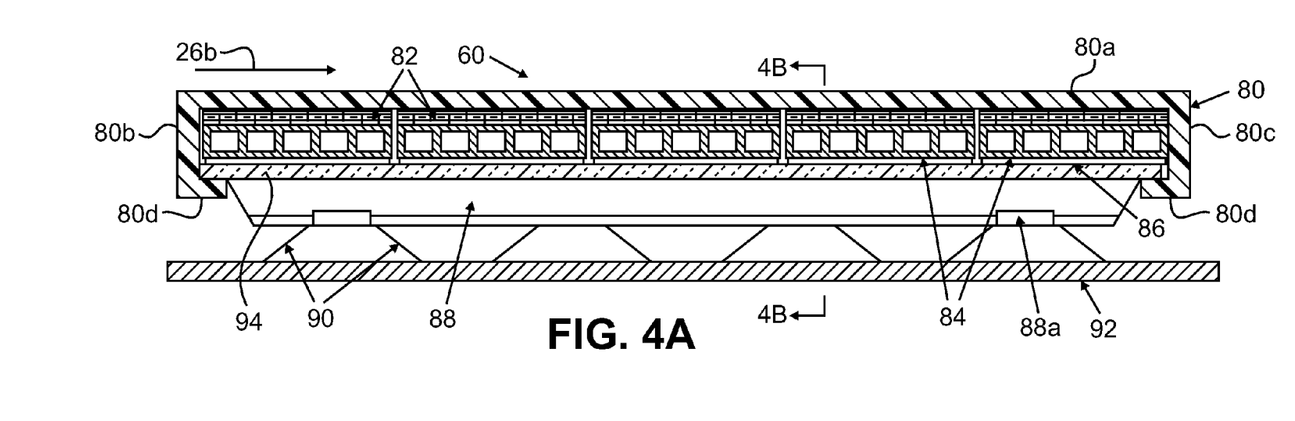
FIG. 4A is an axial section view of a portion of the heat exchanger of FIG. 3.
Figure 4B:
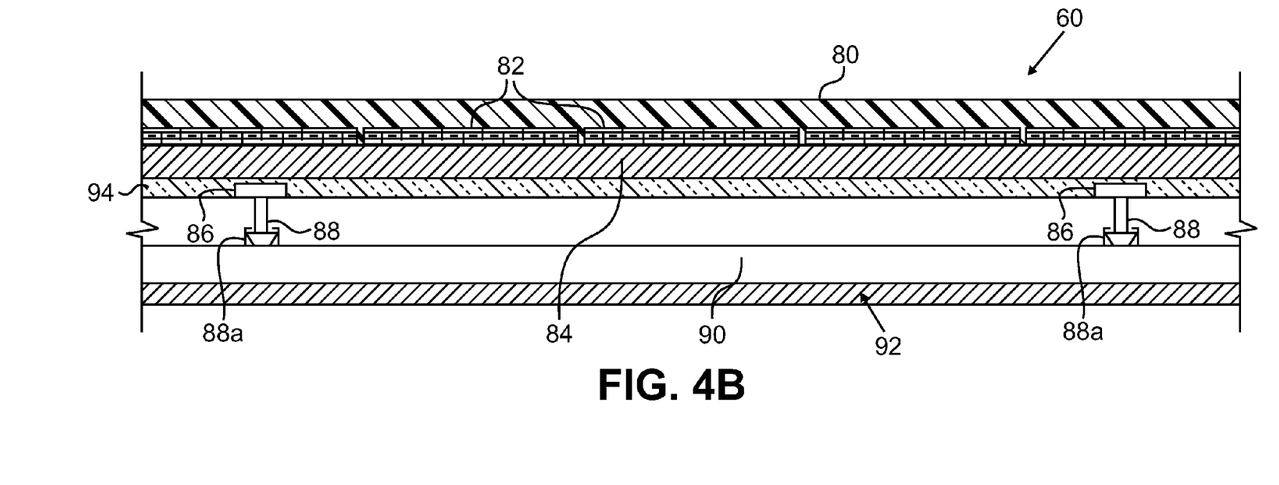
FIG. 4B is a cross-sectional view of the heat exchanger taken along line 4B-4B of FIG. 4A.

FIGS. 4A and 4B are detail views of a portion of heat exchanger 60. FIG. 4A is an axial section view of a portion of heat exchanger 60 and FIG. 4B is a cross-sectional view of heat exchanger 60 taken along section line 4B-4B of FIG. 4A. Heat exchanger 60 includes gas flow conduit 80, one or more thermoelectric (TE) devices 82, one or more fuel cooled tubes 84, resilient members 86, support beams 88, truss 90, and casing 92. Thermal insulation 94 can optionally be provided adjacent to the fuel cooled tubes 84 opposite the TE devices 82. In FIGS. 4A and 4B, gas flow conduit 80 is configured to at least partially surround flow 26b and may be formed as a 2-D or 3-D type conduit. In order to withstand the extreme operating temperatures of hypersonic flight, gas flow conduit 80 may be manufactured from, for example, high temperature alloys or ceramics, or a ceramic matrix composite (CMC), such as that described in U.S. Pat. No. 6,627,019. CMC is approximately one third the density of metal and therefore provides a significant weight savings over a metal conduit. In some applications, a metal may tend to overheat because the TE devices 82 may act as a thermal insulator between the conduit 80 and the fuel-cooled tubes 84. CMC can typically operate at higher temperatures than metal, which makes it less likely to overheat in such applications. In the illustrated embodiment, conduit 80 is arranged between flow 26b and TE devices 82, however the direction of flow 26b is shown merely for illustrative purposes and can vary as desired in alternative embodiments. Adjacent to (e.g., radially outward from) TE devices 82 are fuel cooled tubes 84. TE devices 82 are therefore arranged between the relatively hot gas flow conduit 80 and the relatively cool fuel cooled tubes 84, and can generate electricity from the thermal differential there between. The high heat flux into the hot gas flow conduit 80 from the hypersonic gas flow and combustion contributes to high levels of power being produced. Although in the illustrated embodiment fuel cooled tubes 84 are configured in sets of five generally rectangular tubes, the number, shape, and size of fuel cooled tubes used in heat exchanger 60 can vary as desired for particular applications. For example, fuel cooled tubes 84 can be arranged in sets of three tubes having a generally circular cross-section, or sets of one tube having a generally rectangular cross-section (see, e.g., FIG. 6).

Generally speaking, known TE devices produce a voltage in the presence of a temperature difference between two different electrically conductive materials. The voltage causes a continuous electrical current to flow in the conductors if they form a complete loop. The electrical current generated can be used to, for example, power accessory systems on an aircraft as discussed with reference to FIG. 3 above. TE devices generally function best with good thermal contact, and correspondingly good thermal conduction, between the TE device and, for example, a gas flow conduit of a fuel-cooled heat exchanger. However, manufacturing and assembly tolerances, variations in position and size in components during operation, and other factors may degrade contact between the TE device and the conduit. Therefore, embodiments of the present invention employ one or more resilient members 86 to bias the TE devices 82 into contact with both the relatively hot gas flow conduit 80 and the relatively cool fuel cooled tubes 84 between which the TE devices 82 are arranged. The biasing load placed on the TE devices 82 by the resilient members 86, directly or indirectly, can be selected to be sufficiently great to ensure contact, while remaining below the structural limits of the TE device 82. For example, a functional range for TE devices 82 used in embodiments of the present invention is approximately 140 to 350 kPa (20 to 50 psi).

In FIG. 4A, a cross-sectional profile of gas flow conduit 80 is generally C-shaped, including first, second and third sides 80a, 80b, 80c, respectively, and an interrupted fourth side 80d. First side 80a includes a first face adjacent gas flow 26b and a second face in contact with TE devices 82. The second and third sides 80b and 80b both extend from the first side 80a, and are arranged opposite one another. The interrupted fourth side 80b includes portions that extend from the second and third sides 80b and 80c with a gap in between.

As illustrated in FIGS. 4A and 4B, heat exchanger 60 can include multiple TE devices 82, fuel cooled tubes 84, and resilient members 86 arranged in combination to substantially cover gas flow conduit 80. In the portion of heat exchanger illustrated in FIG. 4A, TE devices 82, fuel cooled tubes 84, and resilient members 86 are arranged at least partially within first, second, third, and fourth sides 80a, 80b, 80c, and 80d of gas flow conduit 80. TE devices 80 are arranged between gas flow conduit 80 and fuel cooled tubes 84. Fuel cooled tubes 84 are arranged between TE devices 82 and resilient members 86. Support beam 88 engages interrupted fourth side 84d of gas flow conduit 80 and can thereby compress resilient members 86 to bias the fuel cooled tubes 84 to help keep TE devices 82 in substantially continuous physical contact with fuel cooled tubes 84 and gas flow conduit 80.

Resilient members 86 are corrugated thin plates of a resilient material, for example, spring steel. In alternative embodiments, the resilient members can be, for example, coil springs. Casing 92 and support beam 88 can be further supported by truss 90 arranged therebetween. Truss 90 has a corrugated configuration in the illustrated embodiment. Support beam 88 can be connected to truss 90 with beam clips 88a, for example, as shown in FIGS. 4A and 4B.

Figure 5:
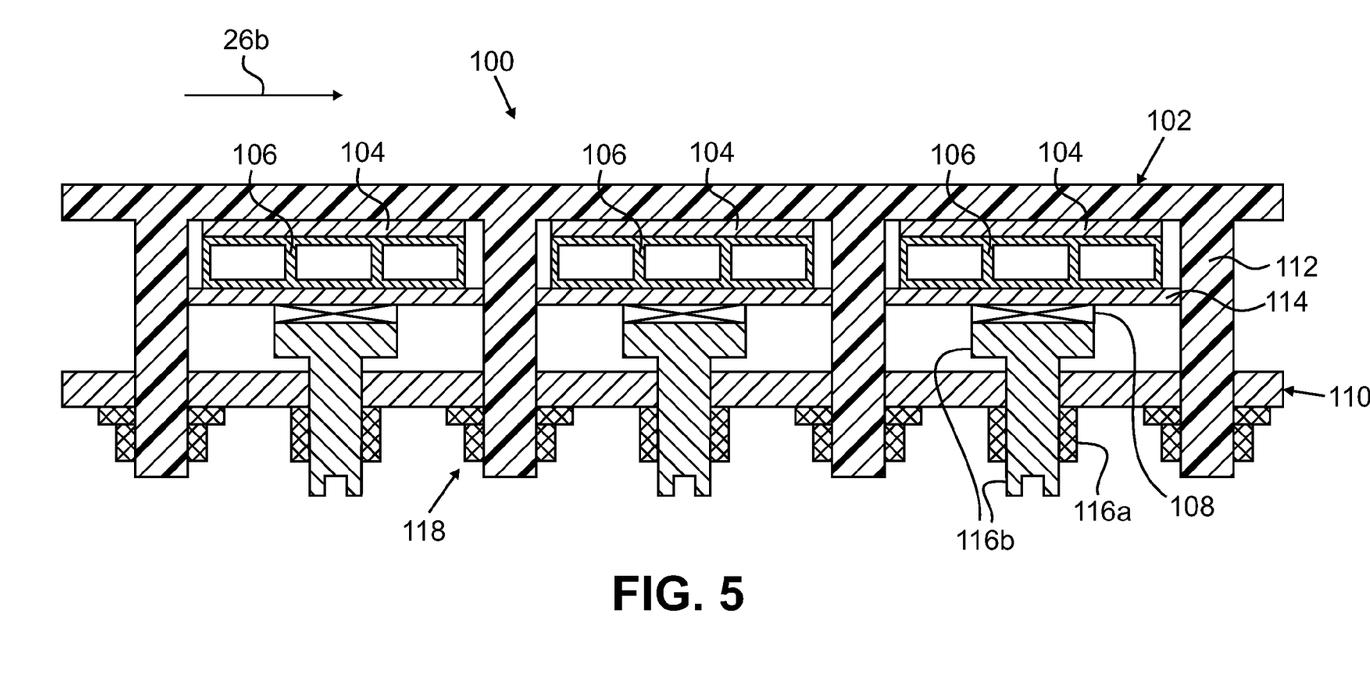
FIG. 5 is an axial section view of a portion of an alternative fuel-cooled heat exchanger.

FIG. 5 is an axial section view of a portion of an alternative heat exchanger 100 including gas flow conduit 102, TE devices 104, fuel cooled tubes 106, resilient members 108, backing plate 110, supports 112, pressure plates 114, preload fasteners 116, and attachment fasteners 118. In FIG. 5, gas flow conduit 102 at least partially surrounds gas flow path 26b, and can be formed as a 2-D or 3-D type conduit. It should be noted that the direction of the gas flow path 26b shown in FIG. 5 is shown merely by way of example, and can vary as desired for particular embodiments. In order to withstand the extreme operating temperatures of hypersonic flight, gas flow conduit 102 can be manufactured from, for example, high temperature alloys or ceramics, or a CMC material, as discussed above with respect to a previous embodiment. Conduit 102 is arranged between gas flow path 26b and TE devices 104. Adjacent to (e.g., radially outward from) TE devices 104 are fuel cooled tubes 106. TE devices 104 are therefore arranged between the relatively hot gas flow conduit 102 and the relatively cool fuel cooled tubes 106, and can generate electricity from the thermal differential therebetween. Supports 112 extend between backing plate 110 and gas flow conduit 102. Backing plate 110 can be connected to supports 112 by attachment fasteners 118. Attachment fasteners 118 can be bolts, screws, rivets, or the like. Pressure plates 114 are arranged between resilient members 108 and TE devices 104. Preload fasteners 116 include lock nuts 116a and set screws 116b, and are configured to preload pressure plate 114 by compressing resilient members 108 relative to backing plate 110 and preload fasteners 116 to help keep TE devices 104 in substantially continuous physical contact with fuel cooled tubes 106 and gas flow conduit 102. Resilient members 108 can be, for example, coil springs or Belleville washers (i.e., disc springs).

Figure 6:
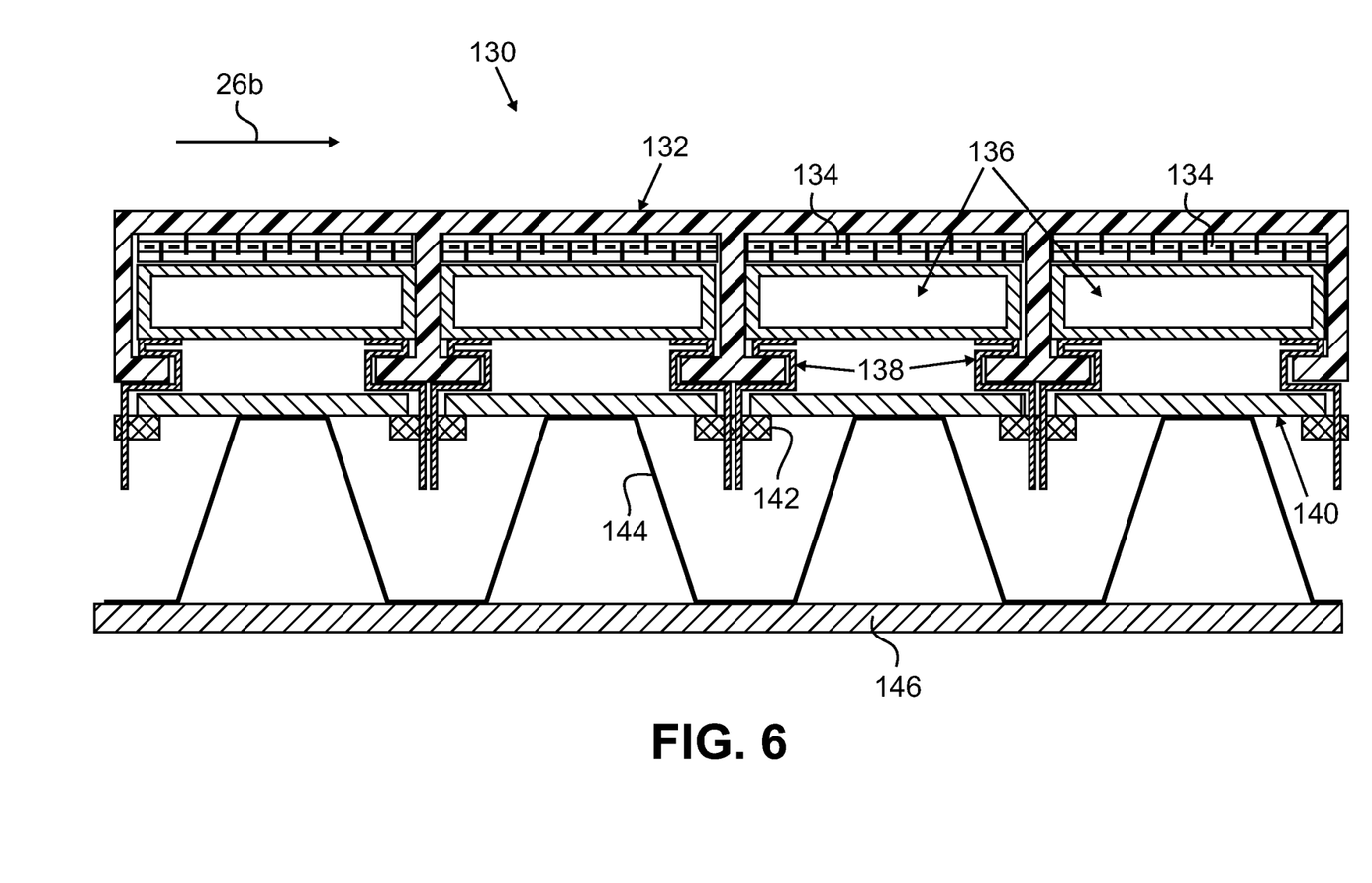
FIG. 6 is an axial section view of a portion of another alternative heat exchanger.

FIG. 6 is an axial section view of a portion of another alternative heat exchanger 130 including gas flow conduit 132, TE devices 134, fuel cooled tubes 136, resilient members 138, support plates 140, fasteners 142, truss 144, and casing 146. In FIG. 6, gas flow conduit 132 at least partially surrounds gas flow path 26b and can be formed as a 2-D or 3-D type conduit. Gas flow conduit 132 can be manufactured from, for example, high temperature alloys or ceramics, or a CMC material. Conduit 132 is arranged between gas flow path 26b and TE devices 134. Adjacent to (e.g., radially outward from) TE devices 134 are fuel cooled tubes 136. TE devices 134 are therefore arranged between the relatively hot gas flow conduit 132 and the relatively cool fuel cooled tubes 136, and can generate electricity from the thermal differential therebetween. In the illustrated embodiment, gas flow conduit 132 includes multiple adjacent C-shaped portions, each of which contains one TE device 134, one fuel cooled tube 136, and multiple resilient members 138. Resilient members 138 can be generally C-shaped springs (or other types of springs, such as leaf springs) arranged between portions (e.g., interrupted sides) of each C-shaped portion of gas flow conduit 132 and fuel cooled tubes 136, typically at opposite edges of each fuel cooled tube 136. Support plates 140 are attached to gas flow conduit 132 by fasteners 142. Fasteners 142 are configured to generate a load on support plates 140, which in turn transfers the load to the hook shaped portion of fasteners 142 that engages gas flow conduit 132. The load transferred to fasteners 142 acts to compress resilient members 138 against fuel cooled tubes 136 to help keep TE devices 134 in substantially continuous physical contact with fuel cooled tubes 136 and gas flow conduit 132. Casing 146 can be attached to support plates 140 and supported by truss 144 arranged between casing 146 and support plates 140.

Figure 7:
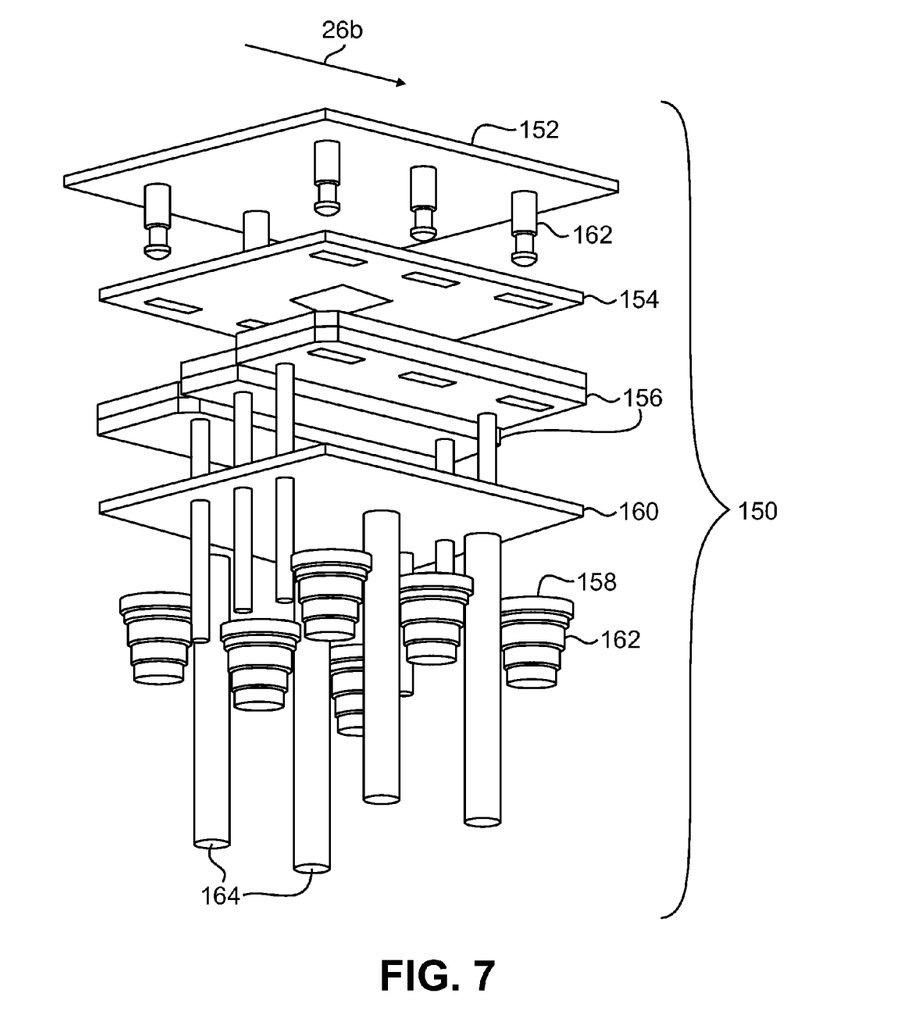
FIG. 7 is an exploded perspective view of a portion of yet another alternative heat exchanger.

FIG. 7 is an exploded perspective view of a portion of yet another alternative heat exchanger 150 including gas flow conduit 152, TE devices 154, fuel cooled tubes 156, resilient members 158, support plate 160, fasteners 162, and support columns 164. In FIG. 7, gas flow conduit 152 at least partially surrounds gas flow path 26b and can be formed as a 2-D or 3-D type conduit. In order to withstand the extreme operating temperatures of hypersonic flight, gas flow conduit 152 can be manufactured from, for example, high temperature alloys or ceramics, or a CMC material. Conduit 152 is arranged between gas flow path 26b and TE devices 154. Adjacent to (e.g., radially outward from) TE devices 154 are fuel cooled tubes 156. TE devices 154 are therefore arranged between the relatively hot gas flow conduit 152 and the relatively cool fuel cooled tubes 156. Fasteners 162 (shown in FIG. 7 to include a threaded shaft and nut) fix TE devices 154 and fuel cooled tubes 156 between gas flow conduit 152 and support plate 160. Interposed between support plate 160 and fasteners 162 are resilient members 158, which may be, for example, coil springs or Belleville washers. Fasteners 162 are thereby configured to generate a preload that compresses resilient members 158 against support plate 160 to bring TE devices 154 into contact with fuel cooled tubes 156 and gas flow conduit 152. Support columns 164 can be employed to provide structural support between support plate 160 and, for example, a ramjet casing (not shown).

Embodiments of the present invention employing TE devices enable many, if not all of a vehicle's secondary power requirements to be met by the heat exchanger with lighter weight and lower volume compared to both hydrazine auxiliary power unit (APU) and battery based systems. Embodiments of the present invention help increase thermal conduction of the TE device in a fuel-cooled heat exchanger by employing one or more resilient members to bias the TE device into substantially continuous physical contact with both (a) the hot gas flow conduit and (b) the cool fuel cooled tubes, between which the TE device is arranged. The load placed on the TE device by the resilient members, directly or indirectly, is sufficient to promote physical contact, while remaining below the structural limits of the TE device. Such contact can be maintained across extreme and/or varying thermal and mechanical conditions experienced during flight (e.g., differential thermal growth between the various components in both steady state and transient conditions). Increasing thermal conduction between the TE device and adjacent components helps increase the efficiency and magnitude of power generated by the TE device. Fuel-cooled heat exchangers according to the present invention therefore improve vehicle range compared to the more traditional approaches, such as the hydrazine APU based approach, because of enhanced electrical power generation capabilities.

EXAMPLES

Performance testing of the present invention was carried out using a prototype having a similar configuration to heat exchanger 150 shown in FIG. 7. The heat exchanger was tested in an atmospheric burner rig. The atmospheric burner rig testing demonstrated integration of a thermoelectric device into a ceramic matrix composite (CMC) fuel-cooled HEX structure under conditions relevant to a scramjet engine. The following two TE devices fabricated by Research Triangle Institute (RTI) of Research Triangle Park, N.C. were tested in the heat exchanger under temperature conditions present in an isolator section of a scramjet flowpath: 1) single stage lead telluride/tellurium-antimony-germanium-silver (PbTe/TAGS) and 2) two stage cascade with silicon germanium upper stage and lead telluride/tellurium-antimony-germanium-silver lower stage (SiGe//PbTe/TAGS). A maximum power output of 13.4-16 watts with a Watt density of 2.4-2.8 W/cm² was achieved for the single stage lead telluride/tellurium-antimony-germanium-silver (PbTe/TAGS) device for thermal differentials (ΔT) between 456-514° C. at hot face temperatures between 550-609° C. for 3-4 minute run times. The heat exchanger was also successfully tested for 18 minutes with minimum power degradation and no effect on the CMC hot face (i.e. the face of the gas flow conduit surrounding the gas flow). The 18 minute test time is in excess of a typical 15 minute missile flight time. In another test, a power of 10 watts was achieved with the higher temperature differentials between 685-721° C. at hot face temperatures between 765-790° C. and two stage cascade TE devices with a silicon germanium upper stage and a lead telluride/tellurium-antimony-germanium-silver lower stage (SiGe//PbTe/TAGS) device. The heat exchanger performed as designed for a total accumulated test time of 107 minutes with hot-face temperatures up to 1100° C.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims. For example, the present invention can be utilized with a variety of types of engines for electrical power generation.

The invention claimed is:

1. An apparatus comprising:
   an inlet conduit assembly surrounding a gas flow path, the inlet conduit assembly comprising:
      a thermoelectric (TE) device configured to convert heat into electrical energy;
      a gas flow conduit arranged between the gas flow path and the TE device; and
      a resilient member configured to bias the TE device into contact with the gas flow conduit, wherein the resilient member is configured to apply a load on the TE device of approximately 140 to 350 kPa (20 to 50 psi); and
      a pressure plate arranged between the resilient member and the TE device, wherein the resilient member is in direct contact with the pressure plate; and
   a combustor arranged downstream of the inlet conduit assembly.

2. The apparatus of claim 1, wherein the inlet conduit assembly further comprises:
   a tube configured to be cooled by a fuel, wherein the TE device is arranged between the gas flow conduit and the fuel-cooled tube.

3. The apparatus of claim 2, wherein the fuel-cooled tube is arranged between the TE device and the resilient member.

4. The apparatus of claim 1, wherein the apparatus further comprises:
   a backing plate;
   two or more supports extending between the backing plate and the gas flow conduit; and
   a fastener configured to compress the resilient member against the pressure plate;
   wherein the resilient member is arranged between the backing plate and the pressure plate.

5. The apparatus of claim 4, wherein the TE device comprises a plurality of TE devices and the resilient member comprises one or more resilient members.

6. The apparatus of claim 1, wherein the gas flow conduit comprises a ceramic matrix composite.

7. The apparatus of claim 1, wherein the gas flow conduit comprises one of a generally rectangular or annular shape in a direction substantially perpendicular to the gas flow path.

8. The apparatus of claim 1, wherein at least a portion of the gas flow conduit comprises an uninterrupted first side configured to face the gas flow path.

9. A vehicle comprising:
   a fuselage; and
   a ramjet connected to the fuselage and comprising a fuel-cooled heat exchanger surrounding a gas flow path of the ramjet, wherein the fuel-cooled heat exchanger comprises:
      a thermoelectric (TE) device configured to convert heat into electrical energy;
      a gas flow conduit arranged between the gas flow path and the TE device; and
      a resilient member configured to bias the TE device into contact with the gas flow conduit, wherein the resilient member is configured to apply a load on the TE device of approximately 140 to 350 kPa (20 to 50 psi); and
      a pressure plate arranged between the resilient member and the TE device, wherein the resilient member is in direct contact with the pressure plate.

10. The vehicle of claim 9, wherein the heat exchanger further comprises:
    a tube configured to be cooled by a fuel, wherein the TE device is arranged between the gas flow conduit and the fuel-cooled tube.

11. The vehicle of claim 10, wherein the fuel-cooled tube is arranged between the TE device and the resilient member.

12. The vehicle of claim 9, wherein the gas flow conduit comprises a ceramic matrix composite.

13. The vehicle of claim 9, wherein the gas flow conduit comprises one of a generally rectangular or annular shape in a direction substantially perpendicular to the gas flow path.

14. The vehicle of claim 9, wherein at least a portion of the gas flow conduit comprises an uninterrupted first side configured to face the gas flow path.

15. An apparatus comprising:
    an inlet conduit assembly surrounding a gas flow path, the inlet conduit assembly comprising:
       a thermoelectric (TE) device configured to convert heat into electrical energy;
       a gas flow conduit arranged between the gas flow path and the TE device; and
       a resilient member configured to bias the TE device into contact with the gas flow conduit,
       wherein at least a portion of the gas flow conduit has a generally C-shape comprising uninterrupted first, second and third sides, and an interrupted fourth side, the first side comprising a first face adjacent the gas flow path and a second face in contact with the TE device; and
       wherein the first, second, third and fourth sides of the gas flow conduit enclose a space within which the TE device and the resilient member are arranged; and
    a combustor arranged downstream of the inlet conduit assembly.

16. The apparatus of claim 15, wherein the inlet conduit assembly further comprises a support member configured to engage the interrupted fourth side of the gas flow conduit and compress the resilient member to apply a load on the TE device.

17. The apparatus of claim 15, wherein the interrupted fourth side comprises:
   a first portion extending generally perpendicular to the second side;
   a second portion extending generally perpendicular to the third side toward the first portion; and
   a gap between the first and second portions defining the interruption in the fourth side;
   wherein the resilient member comprises one or more resilient members arranged in compression between the first and second portions of the fourth side and the TE device.

18. The apparatus of claim 17, wherein the inlet conduit assembly further comprises a member interposed between the one or more resilient members and the TE device.

19. The apparatus of claim 18, wherein the member comprises one or more of a support plate, a support beam, and a tube configured to be cooled by a fuel.

20. The apparatus of claim 15, wherein the TE device comprises a plurality of TE devices and the resilient member comprises one or more resilient members.

21. The apparatus of claim 20, wherein the gas flow conduit comprises:
   a plurality of adjacent C-shaped portions each of which is configured to contain at least one of the TE devices and at least one of the resilient members.

22. The apparatus of claim 21, wherein the inlet conduit assembly further comprises a member interposed between the at least one TE device and the at least one resilient member.

23. The apparatus of claim 22, wherein the member comprises one or more of a support plate, a support beam, and a tube configured to be cooled by a fuel.

24. The apparatus of claim 20, wherein the gas flow conduit comprises:
   a single C-shaped portion configured to contain the plurality of TE devices and the one or more resilient members.

25. The apparatus of claim 24, wherein the inlet conduit assembly further comprises a member interposed between the TE devices and the one or more resilient members.

26. The apparatus of claim 25, wherein the member comprises one or more of a support plate, a support beam, and a tube configured to be cooled by a fuel.

27. An apparatus comprising:
   an inlet conduit assembly surrounding a gas flow path, the inlet conduit assembly comprising:
      a thermoelectric (TE) device configured to convert heat into electrical energy, wherein the TE device comprises a plurality of TE devices;
      a gas flow conduit arranged between the gas flow path and the TE device; and
      a resilient member configured to bias the TE device into contact with the gas flow conduit, wherein the resilient member comprises one or more resilient members;
      a backing plate;
      more than two supports extending between the backing plate and the gas flow conduit;
      a pressure plate arranged between the resilient member and the TE device; and
      a fastener configured to compress the resilient member against the pressure plate;
      wherein the resilient member is arranged between the backing plate and the pressure plate, and
      wherein at least one TE device and at least one resilient member is arranged between every pair of two supports; and
   a combustor arranged downstream of the inlet conduit assembly.

* * * * *